US008263976B2

(12) United States Patent
Schultz et al.

(10) Patent No.: US 8,263,976 B2
(45) Date of Patent: Sep. 11, 2012

(54) SEMICONDUCTOR STRUCTURE WITH COINCIDENT LATTICE INTERLAYER

(75) Inventors: Brian D. Schultz, Raleigh, NC (US); Gary Elder McGuire, Chapel Hill, NC (US)

(73) Assignee: International Technology Center, Raleigh, NC (US)

( * ) Notice: Subject to any disclaimer, the term of this patent is extended or adjusted under 35 U.S.C. 154(b) by 0 days.

(21) Appl. No.: 13/104,541

(22) Filed: May 10, 2011

(65) Prior Publication Data

US 2011/0210373 A1    Sep. 1, 2011

Related U.S. Application Data

(62) Division of application No. 12/283,368, filed on Sep. 11, 2008, now Pat. No. 7,960,259.

(60) Provisional application No. 60/975,299, filed on Sep. 26, 2007.

(51) Int. Cl.
    *H01L 29/72* (2006.01)
(52) U.S. Cl. ............. 257/43; 252/76; 252/190; 252/632
(58) Field of Classification Search .................... 257/43, 257/76, 190, 632
See application file for complete search history.

(56) References Cited

U.S. PATENT DOCUMENTS

| 5,248,633 | A * | 9/1993 | Morar et al. ................ 438/526 |
| 6,291,319 | B1 | 9/2001 | Yu et al. |
| 6,583,034 | B2 | 6/2003 | Ramdani et al. |
| 2007/0187694 | A1 * | 8/2007 | Pfeiffer ............................. 257/76 |

OTHER PUBLICATIONS

Savage, "Graphene Could Make Nonvolatile Molecular Memory," IEEE Spectrum Online, Aug. 2008.
Berger et al., "Electronic Confinement and Coherence in Patterned Epitaxial Graphene," Science Mag., vol. 312, pp. 1191-1196. May 26, 2006.
De Crescenzi et al., "Acetylene on Si (1 1 1): carbon incorporation in the growth of c-SiC thin layers," Surface Science 489, pp. 185-190, Mar. 20, 2001.
Fathauer, R.W. et al, "Surface morphology of epitaxial CaF$_2$ films on Si Substrates," Applied Physics Letter 45, pp. 519-521, Sep. 1984.
Geim e al., "The Rise of Graphene,"Nature Materials, vol. 6, pp. 183-191, Mar. 2007.
Forbeaux et al., "Heteroepitaxial Graphite on 6$H$-SiC(0001): Interface formation through conduction-band electronic structure," Physical Review B, vol. 58, No. 24, pp. 16 396-16 406, Dec. 1998.
Himpsel et al., "Surface Physics in Silicon Molecular Beam Epitaxy," J. Electrochem, pp. 2844-2888, Nov. 1988.
Miller, "New Sheet Structures may be the basis for boron nanotubes," Physics Today, pp. 20-21, Nov. 2007.

(Continued)

*Primary Examiner* — Edward Wojciechowicz
(74) *Attorney, Agent, or Firm* — Miller Patent Services; Jerry A. Miller

(57) ABSTRACT

A semiconductor structure consistent with certain implementations has a crystalline substrate oriented with a {111} plane surface that is within 10 degrees of surface normal. An epitaxially grown electrically insulating interlayer overlays the crystalline substrate and establishes a coincident lattice that mates with the surface symmetry of the {111} plane surface. An atomically stable two dimensional crystalline film resides on the epitaxial insulating layer with a coincident lattice match to the insulating interlayer. This abstract is not to be considered limiting, since other embodiments may deviate from the features described in this abstract.

22 Claims, 4 Drawing Sheets

OTHER PUBLICATIONS

Nakagawara et al., "Effects of buffer layers in epitaxial growth of $SrTiO_3$ thin film on Si(100)," Journal of Applied Physics 78 (12), pp. 7226-7230, Dec. 1995.

Novoselov et al., "Electric Field Effect in Atomically Thin Carbon Films," Sciencemag.org, vol. 306, pp. 666-669, Oct. 2004.

Novoselov et al., "Materials and Methods" Supporting Online Material for "Electric Field Effect in Atomically Thin Carbon Films," Oct. 2004.

Trampert et al., "Herteroepitaxy of Large-Misfit Systems: Role of Coincidence Lattice," Cryst. Res. Technol., pp. 793-806, May 2000.

Rollings et al., "Synthesis and charcterization of atomically thin graphite films on a silicon carbide substrate," ScienceDirect, Journal of Physics and Chemistry of Solids 67, pp. 2172-2177, 2006.

Schäfer et al., "Formation of the interface between c-Si(1 1 1) and diamond-like carbon studied with photoelectron spectroscopy," Applied Surface Science, 123/124, pp. 11-16, 1998.

Wang et al., "Epitaxy of atomically flat $CaF_2$ films on Si(1 1 1) Substrates," Thin Solid Films, 410, pp. 72-72, Sep. 2001.

Xu et al., "Bridgman growth and characterization of calcium fluoride crystals," Journal of Crystal Growth 292, pp. 391-394, May 2006.

* cited by examiner

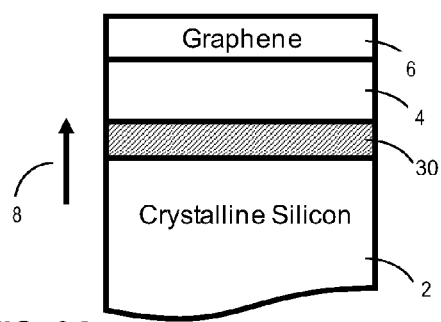
FIG. 3A
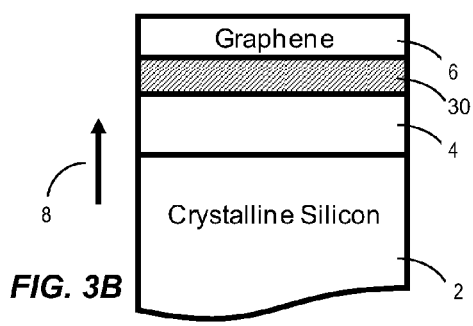
FIG. 3B
FIG. 3C
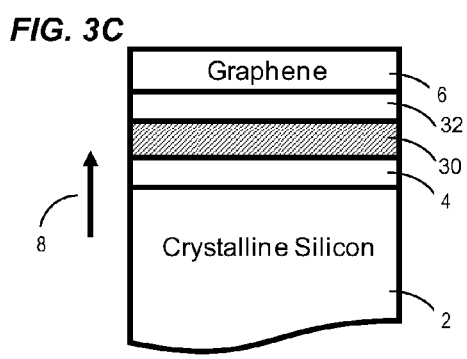
FIG. 3D
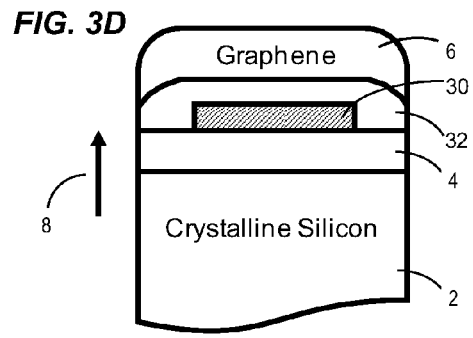

SEMICONDUCTOR STRUCTURE WITH COINCIDENT LATTICE INTERLAYER

CROSS REFERENCE TO RELATED DOCUMENTS

This application is a divisional application of allowed U.S. patent application Ser. No. 12/283,368 filed Sep. 11, 2008 now U.S. Pat. No. 7,960,259 which claims priority benefit of U.S. Provisional Patent Application No. 60/975,299 filed Sep. 26, 2007 both of which are hereby incorporated herein by reference.

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

BACKGROUND

Graphene is a two dimensional counterpart to graphite in that graphite is composed of alternating stacking arrangements of graphene-like layers. Graphene's carbon crystalline structure makes it an ideal candidate for use in fabrication of many electronic components. However, in order to realize the full potential of graphene and other atomic layer structures in this application on a commercial scale, techniques must be developed which permit stabilization of single layers on crystalline substrates.

BRIEF DESCRIPTION OF THE DRAWINGS

Certain illustrative embodiments showing organization and method of operation, together with objects and advantages may be best understood by reference detailed description that follows taken in conjunction with the accompanying drawings in which:

FIG. 3, which is made up of FIGS. 3A, 3B, 3C and 3D shows four additional embodiments consistent with the invention involving the addition of a conducting layer.

DETAILED DESCRIPTION

Figure 1:
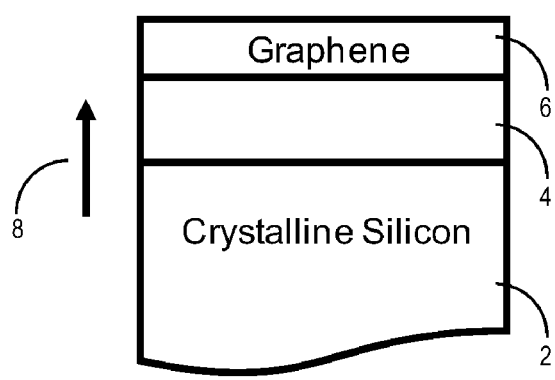
FIG. 1 shows a sketch of a method for growing one or more crystalline graphene layers on a substrate such as silicon consistent with certain embodiments of the invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "one embodiment", "certain embodiments", "an embodiment", "an implementation", or similar terms means that a particular feature, structure, or characteristic described in connection with the embodiment or implementation is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The term "coincident lattice" as used herein is defined as a structure wherein the lattice parameters of two crystalline materials are both integral factors of the lattice spacing for a coincident lattice between to two materials. The coincident lattice structure results in a near epitaxial match (generally within a few percent, and less than about 10 percent) between the two materials at some distance greater than or equal to the larger lattice parameter of the two materials. Perfect coincidence sites between an epitaxial layer with a lattice spacing of $a_e$ and a substrate with a lattice spacing of $a_s$ would occur when $a_e/a_s=m/n$, where m and n are both positive integers. If m were to equal (n+1), there would be one extra lattice plane in each unit cell of the coincidence site lattice.

In the present discussion, {111} means the family of planes and includes (111), (−111), (−1−1−1) . . . , etc., and <110> means family of directions as is conventionally defined in materials science.

Carbon nanostructures in the form of fullerenes and nanotubes have been widely studied due to their impressive electrical properties and stability; however, the zero and one dimensional nature of the materials has made incorporation of these materials into traditional electronic device architectures difficult or impractical in many applications. Two dimensional crystalline sheets made up predominantly of carbon and commonly referred to as graphene, can be atomically bonded into a sheet like structure as thin as one atomic layer in width. These materials are expected to possess many of the desirable electrical properties as its lower dimensional counterparts and their two dimensional nature is more applicable to incorporation into electrical device structures than its lower dimensional counterparts. Graphene is also a two dimensional counterpart to graphite in that graphite is composed of alternating stacking arrangements of graphene-like layers.

Unfortunately the methods currently being used to create two dimensional crystalline sheets of graphene are either not compatible with large-scale production technologies or produce rather mediocre quality material. For example, the first demonstrations of stable graphene films were created by mechanical exfoliation of highly oriented pyrolytic graphite (HOPG) substrate. The crudest example of this method is to stick a piece of adhesive tape on the surface of an HOPG substrate which adheres to surface layers on the HOPG and subsequently removes them from the substrate when the tape is peeled back. While this method enables relatively high quality graphene crystallites to be peeled off the substrate, unfortunately the size of the crystallites tends to be less than 100 μm on average. This technique clearly has very limited likelihood of being scalable to produce large scale wafer coverage (e.g., eight inches or larger).

Graphitization of silicon carbide (SiC) surfaces from thermal decomposition reactions can also be achieved. The surface can be decomposed through vacuum annealing to sublime silicon atoms from the surface thereby leaving a carbon rich surface that reorders to form graphene layers on the surface. However, the underlying interface tends to be carbon rich, to contain portions of $sp^3$ bonded carbon, and to contain a number of silicon vacancies at the interface. SEM images of the graphene surfaces have also shown random defects and/or deposits, and unfortunately there is currently no clear understanding from where these undesirable features originate. Although a number of electrical measurements taken from surfaces prepared in this manner have been promising, it is unlikely that such a method can ever prepare an atomically abrupt interface with SiC due to the diffusion profile of silicon that result from the decomposition reactions. In addition, since graphene and graphene-based devices are expected to be extremely sensitive to small changes in thickness and bonding, it is doubtful that uniform high quality device structures can be produced across a full wafer using this method.

It has also been shown that the direct growth of carbon on crystalline silicon {111} surfaces using acetylene ($C_2H_2$) as the carbon source results in the formation of silicon carbide films for growth temperatures between 600° C. to 700° C. and in the formation of a carbon rich silicon carbide ($SiC_x$) surface as the growth temperature is increased from 700° C. to 900° C. The higher temperature growth is closely related to the decomposition method previously described except in this method the interface is governed by the indiffusion of carbon. The result is that the same interfacial problems that arise in the silicon carbide decomposition method also occur in the carbon deposition method.

Plasma enhanced chemical vapor deposition of carbon crystalline silicon {111} using methane ($CH_4$) as the carbon source can result in the formation of a reacted silicon carbide interface with an amorphous C—H layer on top. But, thus far there is no known report of either graphene or graphite growth on silicon surfaces without the formation of some silicon carbide and bonding at the interface. For use in electrical devices, it is desirable to have a method where these reactions can be eliminated.

Hence, in order to realize the potential of stable two dimensional crystalline graphene in electronic applications, a reliable mechanism for creating the films and minimizing substrate reactions is needed that is compatible with large-scale production methods. So far no such method is known to exist. Embodiments and implementations consistent with this invention relate to the fabrication of semiconductor based heterostructures that include an electrically insulating crystalline layer on a crystalline substrate such as a silicon substrate to facilitate growth of a two dimensional crystalline film of one or more atomic layers of graphene or other carbon based crystal.

In accord with certain example implementations, a method is provided for fabricating graphene films of one or more layers on crystalline silicon substrates where an electrically insulating crystalline interlayer is used to provide a stable template for nucleation and growth of a two dimensional crystalline graphene layer(s). The method makes it possible to use the crystalline structure and symmetry of the {111} plane in silicon as a template to assist the nucleation and growth of two dimensional graphene films while eliminating undesirable interfacial reactions between silicon and graphene. An electrically insulating interlayer also provides for isolating the conduction channels of the two dimensional crystalline graphene layer(s) from the starting silicon material where desired.

In accord with certain example implementations, crystalline graphene films can be grown on crystalline substrates such as crystalline silicon substrates by use of an insulating interlayer thereby combining the electrical advantages of graphene with traditional silicon-based CMOS (or similar) technologies. The method can be scaled to allow deposition over any surface area of single crystalline wafer that can be produced. Many advantages of such a production method and the resultant structure will be apparent to those skilled in the art upon consideration of the present teachings.

Example embodiments consistent with the present invention address the problem of how to fabricate crystalline graphene layers on crystalline substrates such as crystalline silicon substrate. Silicon is the current substrate of choice for device manufacturing due to the significant infrastructure and technological knowledge base that has been established over the years (but other crystalline substrates, interlayers and carbon based layers may also be suitable), and therefore silicon will be used in the illustrative examples herein. In this context, the term "insulating" refers to electrical insulation and means that no significant conduction occurs to the substrate, where such significance may be application dependent. Generally, however, the electrical conductivity of the insulating layer should be much less than the electrical conductivity of the carbon based layer.

The {111} surfaces of Si have a threefold crystalline symmetry that is commensurate with the six-fold surface symmetry of graphene. Si {111} surfaces contain a Si—Si in-plane spacing of 3.84 Å, which is about 1.57 times larger than the ring-to-ring spacing in graphene, and is normally too large for direct epitaxial growth. However, a 26.9 Å coincident lattice between the Si {111} surface and graphene reduces the mismatch to less than 0.3% in the <110> directions. Graphene is capable of forming long range coincident lattice matches with the underlying substrate, presumably due to the weaker van der Waals bonding across the interface. The coincident lattice also provides graphene with a mechanism to minimize direct atom to atom bonding to the material on which it is deposited and permits the formation of surface corrugations that help stabilize the film.

One substantial problem with graphene growth directly on silicon is that silicon is not thermodynamically stable during carbon deposition and reacts to form undesirable $SiC_x$ species. The {111} surface of silicon also has the problem that the surface silicon atoms have partially filled electron orbitals that are not electrically stable and which therefore dimerize. This dimerization causes the surface structure to reconstruct into a charge neutral configuration. Additionally Si is not sufficiently insulating to form a base layer in all graphene device structures. Use of an intermediate layer in accord with implementations consistent with this invention ameliorates each of these problems while still utilizing the symmetry and lattice spacing in silicon for graphene growth.

FIG. 1 shows a simple schematic illustrating a macroscopic view of a layered construction of graphene on crystalline substrate 2 such as a silicon crystalline substrate with an intermediate later 4. An epitaxial insulating interlayer 4 is deposited on a crystalline silicon layer 2 prior to the growth of a graphene layer 6 or layers. The growth orientation 8 is perpendicular to the surface of the crystalline silicon layer and within 10 degrees (and preferably much less) of a <111> direction in the crystalline silicon layer. The epitaxial insulating interlayer should maintain an epitaxial alignment with the crystalline silicon layer and have a 3 n fold surface symmetry where n is an integer. The epitaxial alignment and symmetry constraints permit the epitaxial insulating interlayer to maintain the favorable structural template in the form of a coincident lattice established by the silicon layer for nucleation and growth of the graphene layer. Additionally the epitaxial insulating interlayer forms a sufficient diffusion barrier to both carbon and silicon at temperatures up to 250° C. to keep silicon and carbon separated and consequently prevented from reacting during deposition and device processing.

Figure 2:
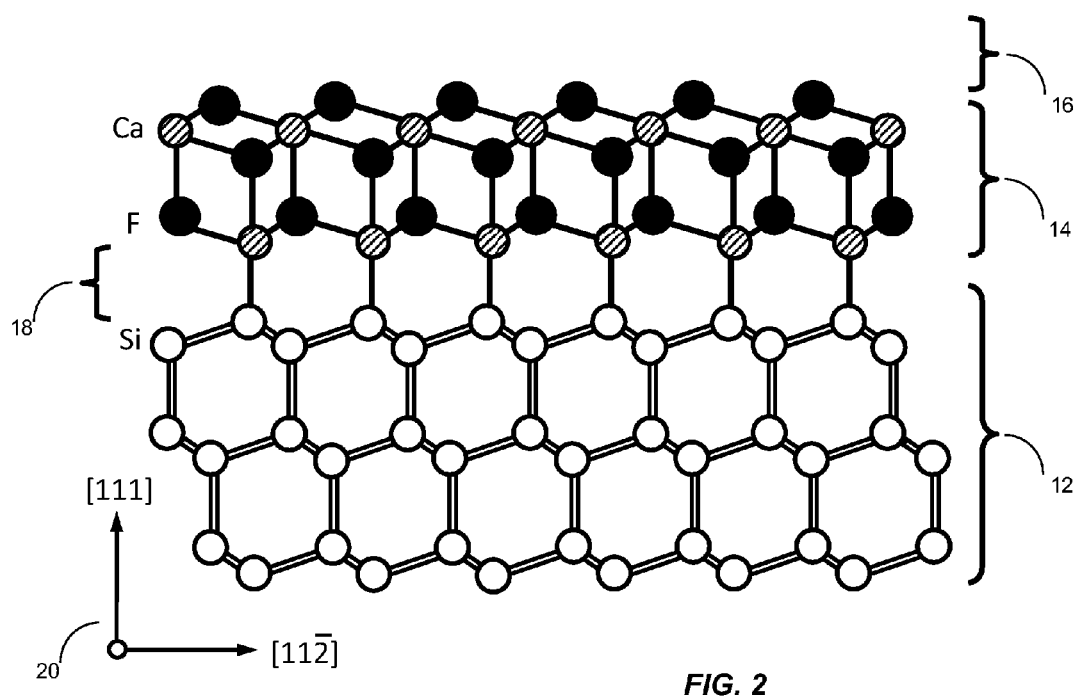
FIG. 2 is a cross-sectional sketch showing an embodiment consistent with certain implementations of the invention using $CaF_2$.

One embodiment of the fabrication is shown in FIG. 2 where calcium fluoride ($CaF_2$) is used as the epitaxial insulating interlayer. $CaF_2$ is an ionically bonded cubic compound with a lattice parameter of 5.46 Å (0.6% larger than Si) and a dielectric constant of about 6.7. $CaF_2$ grows epitaxially on Si {111} surfaces with abrupt Ca—Si bonding at the interface providing the necessary charge neutrality. Atomically flat surfaces can be produced on Si {111} surfaces when grown at substrate temperatures close to 450° C. FIG. 2 shows the epitaxial crystalline alignment forming the coincident lattice between a silicon cross-section 12 and a calcium fluoride cross-section 14 with a crystalline orientation 20 along the {111} and {11$\bar{2}$} directions of the silicon layer. The {111} crystallographic surfaces of $CaF_2$ 16 are the lowest free energy surfaces of $CaF_2$ and they terminate in a stable unreconstructed surface. $CaF_2$ grows in a layer-by-layer growth mode under certain conditions enabling the thickness of the layer to be controlled with atomic scale precision. Although the Si/$CaF_2$ interface will reorder to establish the stable Si—Ca bonding, the two materials do not significantly intermix and are relatively stable in contact with each other up to their respective desorption temperatures. $CaF_2$ is also stable in contact with graphite with graphite crucibles used in the growth of high purity bulk $CaF_2$ crystals. The thermodynamic stability of the $CaF_2$ interlayer with graphene also provides the opportunity to manipulate the energetics of the graphene growth process to find a self assembly regime whereby growth is self limiting and results in only one monolayer of growth.

The embodiment containing $CaF_2$ interlayers grown on crystalline silicon layers provides a template that enables the nucleation and growth of the graphene layer and is non-reactive, thermally stable, electrical insulating, terminates in atomically flat surfaces, is closely lattice matched to Si, and forms a coincident lattice with graphene to control the growth orientation. Other embodiments include but are not limited to the use of $Gd_2O_3$, SrO, or $SrTiO_3$ as the epitaxial insulating layer. In all these embodiments the crystalline structure of the silicon layer is maintained by the epitaxial insulating interlayer while the interlayer provides the desired electrical insulation and physical separation between the carbon and silicon. In other embodiments, other crystalline substrate materials may be similarly mated to graphene by use of other interlayer materials. In each case, the crystalline substrate should have an exposed {111} plane that is as near ideal as possible. Preferably, the substrate will be within a fractional degree (e.g., less than one degree and preferably less than 0.5 degrees) of the surface normal, but may work suitably well when less than about 1-2 degrees of surface normal. It is expected that greater than 10 degrees from surface normal will result in unsatisfactory results due to an unacceptable number of "stair-step" like changes in the surface geometry.

FIG. 3A shows an additional embodiment of the structure depicted in FIG. 1 where an additional epitaxial layer 30 has been grown on the crystalline silicon prior to the deposition of the graphene layer. The additional epitaxial layer may be another insulator, conductor, or semiconductor, but regardless of the electrical properties it should maintain the crystalline symmetry of the crystalline silicon layer and allow for the growth of the epitaxial insulating layer on its surface. Such embodiments could be used to provide a metallic contact for a back gated device structure, or may serve as a diffusion barrier between the silicon and the epitaxial insulating layer if they are not sufficiently stable.

FIG. 3B shows an embodiment where the additional epitaxial layer has been grown between the epitaxial insulating layer and graphene layer. Likewise the embodiment in FIG. 3C shows a possible embodiment where the additional epitaxial interlayer is grown on the epitaxial insulating layer and then a second epitaxial insulating interlayer is subsequently grown on top. An application of such an embodiment would be in back gated transistor structures where it is desired to keep the bottom electrode electrically isolated from the crystalline silicon layer.

FIG. 3D shows an embodiment similar to the one shown in FIG. 3C, except in this embodiment the additional epitaxial layer is patterned either in-situ or ex-situ prior to deposition of the second epitaxial insulating layer. Embodiments consistent with the present invention are not limited in the number of layers that are included between the crystalline silicon and the graphene, only that the heterostructure as a whole retains an epitaxial relationship to the crystalline silicon and maintains a 3 n symmetry to support graphene growth to form a coincident lattice structure.

Figure 4:
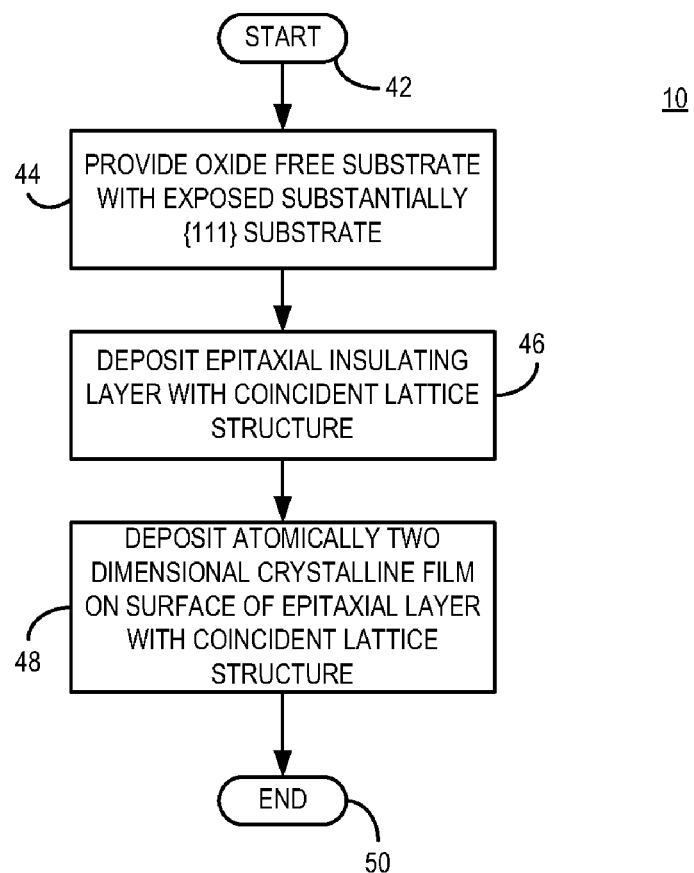
FIG. 4 depicts a process flow chart depicting the basic processes used in fabricating structures as described herein consistent with certain embodiments.

FIG. 4 shows a flow chart depicting the basic flow of a fabrication process 40 consistent with certain example embodiments of the present invention starting at 42. At 44, a crystalline substrate is prepared or provided in which providing a crystalline substrate oriented with a {111} plane surface that is within 10 degrees of surface normal. In one implementation, the substrate is a silicon wafer. Such substrate should be clean and free of oxide. At 46 the process proceeds by epitaxially growing an electrically insulating interlayer overlaying the crystalline substrate to establish a coincident lattice that mates with the surface symmetry of the {111} plane surface to form a thermodynamically stable interface. This can be done using thermal evaporation, chemical vapor deposition or any other suitable deposition process and serves to build a template compatible with the final layer to be applied at 48. In one implementation, the epitaxial layer is substantially calcium fluoride.

At 48, an atomically stable two dimensional crystalline film is deposited on the epitaxial insulating layer with a coincident lattice match to the insulating interlayer. This film can be formed using graphene as disclosed, but other materials such as boron may also be suitable, and other materials will occur to those skilled in the art upon consideration of the present teachings. The growth of the graphene layer may occur whereby any carbon based species in a solid, liquid, and/or gaseous state is controllably introduced to the surface of the epitaxial layers on the crystalline silicon. The growth conditions are ultimately controlled by the sticking coefficient, desorption rate, surface mobility and bond strengths of the source materials in relation to the epitaxial insulating layer structure deposited on the crystalline structure. Ideal growth occurs in a self limiting regime whereby the growth is self terminated after one monolayer has been deposited, but possible growth mechanisms are not limited to this regime. Growth can be initiated via chemical vapor deposition, plasma deposition, plasma assisted chemical vapor deposition, molecular beam epitaxy, thermal evaporation, thermal sublimation, or any related method of producing a controllable flux of carbon containing molecules in the vicinity of the desired growth surface. The process then ends at 50.

In the variations depicted in FIG. 3, the process is varied in a manner that will be clear to those skilled in the art given the present teachings in order to create various electronically useful structures such as transistors and the like.

Many applications are contemplated for the structure shown including but not limited to the fabrication of field effect devices where the graphene layer is used as the conducting channel. Such devices may use either a back gate design incorporated into the epitaxial insulated interlayer or standard metal-oxide layer on the surface. The use of epitaxial layers permits the growth thickness to be controlled with near atomic level precision making it easy to achieve reproducible performance in device structures.

The fabricated structure is not limited to pure carbon containing graphene films. The method is also applicable to carbon based films containing impurity atoms introduced into the film to modify its electrical performance or to other two dimensional structures that may be discovered with similar physical structures and symmetries to those of graphene.

Thus, in certain implementations, a method for fabricating a semiconductor structure involves providing a monocrystalline substrate oriented with a {111} plane surface that is within 10 degrees of surface normal; epitaxially growing an electrically insulating interlayer overlaying the crystalline substrate to establish a coincident lattice that mates with the surface symmetry of the {111} plane surface; and depositing an atomically stable two dimensional crystalline film on the epitaxial insulating layer with a coincident lattice match to the insulating interlayer.

In certain implementations, the monocrystalline substrate comprises substantially a silicon monocrystalline substrate. In certain implementations, the interlayer is fabricated of $CaF_2$. In certain implementations, the atomically stable two dimensional crystalline film is predominantly composed of carbon. In certain implementations, the interlayer is fabricated of a material selected from the group consisting of $Gd_2O_3$, SrO and $SrTiO_3$. In certain implementations, the interlayer is fabricated of an epitaxial oxide having a lattice structure suitable for forming a coincident lattice with both the crystalline substrate and the two dimensional crystalline film. In certain implementations, at least one additional epitaxial layer is grown between the silicon substrate and the electrically insulating layer. In certain implementations, at least one additional epitaxial layer is grown between the electrically insulating layer and the two dimensional crystalline film. In certain implementations, the monocrystalline substrate is oriented with a {111} plane surface that is within 2 degrees of surface normal. In certain implementations, the monocrystalline substrate is oriented with a {111} plane surface that is within ½ degree of surface normal. In certain implementations, the insulating interlayer maintains an epitaxial alignment with the crystalline silicon layer and has a 3 n fold surface symmetry where n is an integer.

Another method for fabricating a semiconductor structure involves providing a monocrystalline silicone substrate oriented with a {111} plane surface that is within 2 degrees of surface normal and having a non-oxidized surface; epitaxially growing an electrically insulating interlayer selected from the group consisting of $CaF_2$, $Gd_2O_3$, SrO and $SrTiO_3$ overlaying the crystalline substrate to establish a coincident lattice that mates with surface symmetry of the {111} plane surface; and depositing an atomically stable two dimensional crystalline film predominantly composed of carbon on the epitaxial insulating layer with a coincident lattice match to the insulating interlayer.

In certain implementations, at least one additional epitaxial layer is grown between the silicon substrate and the electrically insulating layer. In certain implementations, at least one additional epitaxial layer is grown between the electrically insulating layer and the two dimensional crystalline film. In certain implementations, the monocrystalline substrate is oriented with a {111} plane surface that is within 2 degrees of surface normal. In certain implementations, the insulating interlayer maintains an epitaxial alignment with the crystalline silicon layer and has a 3 n fold surface symmetry where n is an integer.

A semiconductor structure consistent with certain implementations has a monocrystalline substrate oriented with a {111} plane surface that is within 10 degrees of surface normal. An epitaxially grown electrically insulating interlayer overlays the crystalline substrate and establishes a coincident lattice that mates with the surface symmetry of the {111} plane surface. An atomically stable two dimensional crystalline film resides on the epitaxial insulating layer with a coincident lattice match to the insulating interlayer.

In certain implementations, the monocrystalline substrate comprises substantially a silicon monocrystalline substrate. In certain implementations, the interlayer is fabricated of $CaF_2$. In certain implementations, the atomically stable two dimensional crystalline film is predominantly composed of carbon. In certain implementations, the interlayer is fabricated of a material selected from the group consisting of $Gd_2O_3$, SrO and $SrTiO_3$. In certain implementations, the interlayer is fabricated of an epitaxial oxide having a lattice structure suitable for forming a coincident lattice with both the crystalline substrate and the two dimensional crystalline film. In certain implementations, at least one additional epitaxial layer is grown between the silicon substrate and the electrically insulating layer. In certain implementations, at least one additional epitaxial layer is grown between the electrically insulating layer and the two dimensional crystalline film. In certain implementations, the monocrystalline substrate is oriented with a {111} plane surface that is within 2 degrees of surface normal. In certain implementations, the monocrystalline substrate is oriented with a {111} plane surface that is within ½ degrees of surface normal. In certain implementations, the insulating interlayer maintains an epitaxial alignment with the crystalline silicon layer and has a 3 n fold surface symmetry where n is an integer.

While certain illustrative embodiments have been described, it is evident that many alternatives, modifications, permutations and variations will become apparent to those skilled in the art in light of the foregoing description.

What is claimed is:

1. A semiconductor structure, comprising:
   a monocrystalline cubic substrate oriented with a {111} plane surface that is within 10 degrees of surface normal;
   an epitaxially grown electrically insulating interlayer overlaying the crystalline substrate that establishes a coincident lattice that mates with the surface symmetry of the {111} plane surface; and
   an atomically stable two dimensional crystalline film on the epitaxial insulating layer with a coincident lattice match to the insulating interlayer.

2. The semiconductor structure according to claim 1, where the monocrystalline substrate comprises substantially a silicon monocrystalline substrate.

3. The semiconductor structure according to claim 1, where the interlayer is fabricated of $CaF_2$.

4. The semiconductor structure according to claim 1, where the atomically stable two dimensional crystalline film is predominantly composed of carbon.

5. The semiconductor structure according to claim 1, where the interlayer is fabricated of a material selected from the group consisting of $Gd_2O_3$, SrO and $SrTiO_3$.

6. The semiconductor structure according to claim 1, where the interlayer is fabricated of an epitaxial oxide having a lattice structure suitable for forming a coincident lattice with both the crystalline substrate and the two dimensional crystalline film.

7. The semiconductor structure according to claim 1, where at least one additional epitaxial layer is grown between the silicon substrate and the electrically insulating layer.

8. The semiconductor structure according to claim 1, where at least one additional epitaxial layer is grown between the electrically insulating layer and the two dimensional crystalline film.

9. The semiconductor structure according to claim 1, where the monocrystalline substrate is oriented with a {111} plane surface that is within 2 degrees of surface normal.

10. The semiconductor structure according to claim 1, where the monocrystalline substrate is oriented with a {111} plane surface that is within ½ degrees of surface normal.

11. The semiconductor structure according to claim 1, where the insulating interlayer maintains an epitaxial alignment with the crystalline silicon layer and has a 3 n fold surface symmetry where n is an integer.

12. A semiconductor structure, comprising:
    a monocrystalline cubic substrate oriented with a {111} plane surface that is within 10 degrees of surface normal;
    an epitaxially grown electrically insulating interlayer overlaying the crystalline substrate that establishes a coincident lattice that mates with the surface symmetry of the {111} plane surface; and
    an atomically stable two dimensional crystalline film on the epitaxial insulating layer with a coincident lattice match to the insulating interlayer, where the atomically stable two dimensional crystalline film predominantly comprises carbon.

13. The semiconductor structure according to claim 12, where the monocrystalline substrate comprises substantially a silicon monocrystalline substrate.

14. The semiconductor structure according to claim 12, where the interlayer is fabricated of a material selected from the group consisting of $CaF_2$, $Gd_2O_3$, SrO and $SrTiO_3$.

15. The semiconductor structure according to claim 12, where the interlayer is fabricated of an epitaxial oxide having a lattice structure suitable for forming a coincident lattice with both the crystalline substrate and the two dimensional crystalline film.

16. The semiconductor structure according to claim 12, where at least one additional epitaxial layer is grown between the silicon substrate and the electrically insulating layer.

17. The semiconductor structure according to claim 12, where at least one additional epitaxial layer is grown between the electrically insulating layer and the two dimensional crystalline film.

18. The semiconductor structure according to claim 12, where the monocrystalline substrate is oriented with a {111} plane surface that is within 2 degrees of surface normal.

19. The semiconductor structure according to claim 12, where the monocrystalline substrate is oriented with a {111} plane surface that is within ½ degrees of surface normal.

20. The semiconductor structure according to claim 12, wherein the insulating interlayer maintains an epitaxial alignment with the crystalline silicon layer and has a 3 n fold surface symmetry where n is an integer.

21. A semiconductor structure, comprising:
    a monocrystalline substrate oriented with a {111} plane surface that is within 10 degrees of surface normal;
    an epitaxially grown electrically insulating interlayer overlaying the crystalline substrate that establishes a coincident lattice that mates with the surface symmetry of the {111} plane surface, where the interlayer is fabricated of a material selected from the group consisting of $Gd_2O_3$, SrO and $SrTiO_3$; and
    an atomically stable two dimensional crystalline film on the epitaxial insulating layer with a coincident lattice match to the insulating interlayer.

22. A semiconductor structure, comprising:
    a substantially silicone monocrystalline cubic substrate oriented with a {111} plane surface that is within 2 degrees of surface normal;
    an epitaxially grown electrically insulating interlayer overlaying the crystalline substrate that establishes a coincident lattice that mates with the surface symmetry of the {111} plane surface;
    an atomically stable two dimensional crystalline film predominantly composed of carbon on the epitaxial insulating layer with a coincident lattice match to the insulating interlayer; and
    where the interlayer is fabricated of a material selected from the group consisting of $CaF_2$, $Gd_2O_3$, SrO and $SrTiO_3$.

* * * * *